United States Patent
Pryce et al.

[19]

[11] Patent Number: 6,073,088
[45] Date of Patent: Jun. 6, 2000

[54] EMS TESTING SYSTEM

[75] Inventors: Jonathan D. G. Pryce, Broadstone; Jonathan T. W. Page, Ferndown; Robert H. Moore, Dorchester; Amanda C. Borrow; Howard S. Whalley, both of Bournemouth, all of United Kingdom

[73] Assignee: Schlumberger Technologies, Inc., San Jose, Calif.

[21] Appl. No.: 09/012,344

[22] Filed: Jan. 23, 1998

[30] Foreign Application Priority Data

Feb. 14, 1997 [GB] United Kingdom ............... 9703066

[51] Int. Cl.$^7$ ............................... G06F 11/00; G01R 31/00
[52] U.S. Cl. ........................ 702/182; 702/183; 702/184; 701/29; 701/102
[58] Field of Search ........................ 702/182, 120, 702/122, 183–184, 29, 33, 35, 99, 102

[56] References Cited

U.S. PATENT DOCUMENTS

| | | |
|---|---|---|
| 4,967,143 | 10/1990 | Raviglione et al. . |
| 5,041,976 | 8/1991 | Marko et al. ........................... 701/29 |
| 5,043,984 | 8/1991 | Tomisawa et al. .................... 714/736 |
| 5,214,582 | 5/1993 | Gray .................................. 364/424.03 |
| 5,307,290 | 4/1994 | Raviglione et al. ............... 364/551.01 |
| 5,541,862 | 7/1996 | Bright et al. ........................... 364/580 |
| 5,550,762 | 8/1996 | Doll ....................................... 364/579 |
| 5,748,916 | 5/1998 | Conway et al. ....................... 710/100 |
| 5,788,336 | 8/1998 | Trovato et al. ............................ 303/1 |

OTHER PUBLICATIONS

John Wagner, "Failure Mode Testing Tool Set for Automotive Electronic Controllers", IEEE Transactions on Vehicular Technology, vol. 43, No. 1, Feb. 1994, pp. 156–163, XP000450957.

*Primary Examiner*—Marc S. Hoff
*Assistant Examiner*—Bryan Bui
*Attorney, Agent, or Firm*—Danita J. M. Maseles; Bruce D. Riter

[57] ABSTRACT

A system for testing an automotive engine management system (EMS), comprises (a) means for generating a series of EMS input signals which are equivalent to input signals generated by an automobile; (b) means for applying the EMS input signals to the EMS in a manner which simulates that of the inputs from an automobile; (c) a series of loads connected to outputs from the EMS, the loads being equivalent to the loads imposed by systems within an automobile under the control of the EMS; (d) sensors for measuring the EMS outputs; and (e) means for coordinating, in real time, application of the EMS inputs and measurement of the EMS outputs.

11 Claims, 1 Drawing Sheet

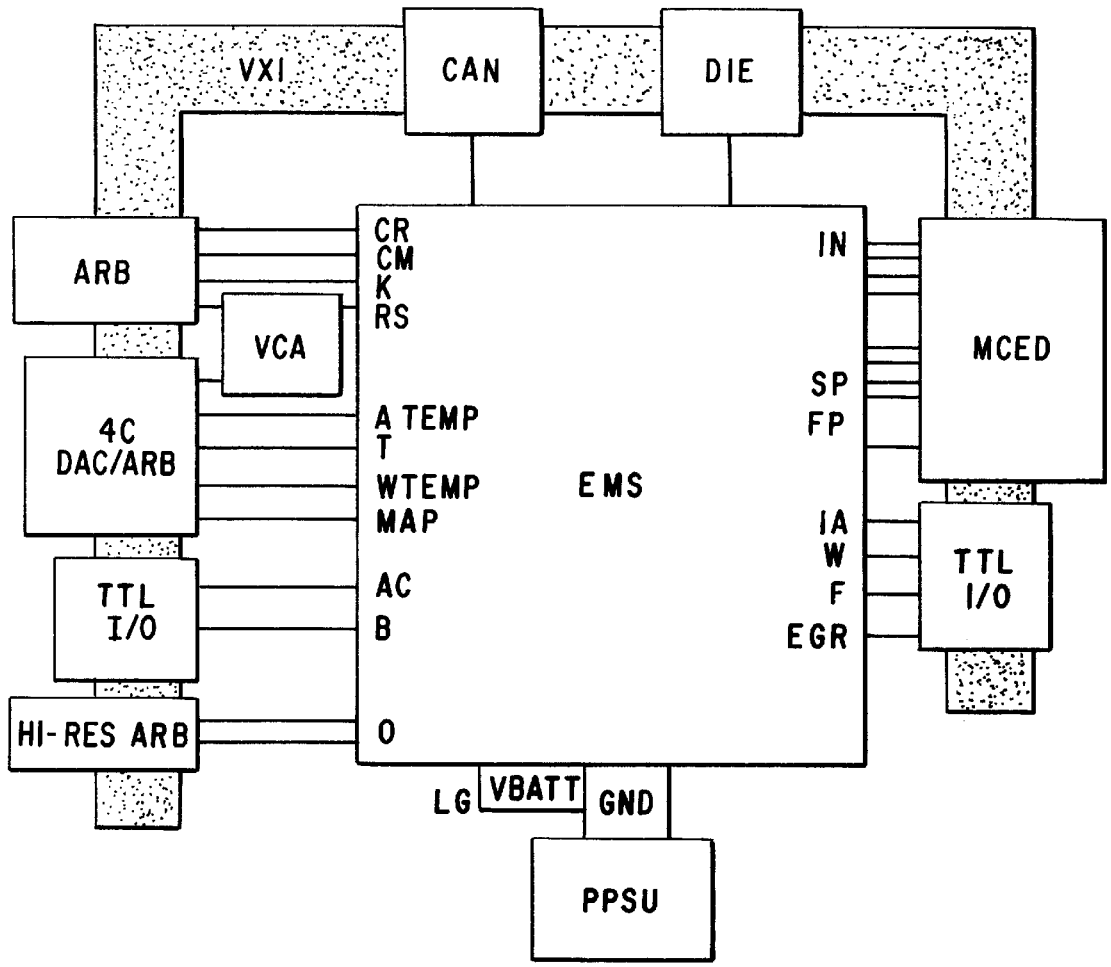

EMS TESTING SYSTEM

FIELD OF THE INVENTION

The present invention relates to a system for testing automobile engine management systems (EMS). In particular, the invention provides a system which can test EMS in open loop so as to simulate the behaviour of an automobile in which the EMS is installed.

BACKGROUND OF THE INVENTION

Engine Management Systems are increasing in complexity to provide better performance and meet tighter vehicle emissions regulations. It is current practice for electronic modules used in an EMS to undergo a conventional process (in-circuit) test before conformal coating. After coating and assembly, functional test is performed at ambient and extreme temperature levels to verify that the module will maintain its performance over a full operating temperature range (−40°C. to +125° C.). When functionally testing EMS modules, additional access is provided by a diagnostic serial interface, which is designed for use during periodic servicing. This serial interface, usually based on the ISO9141 protocol in Europe or J1850 in the USA, can also be used to access diagnostic registers in the module during production test. Additional Built-In Self Test (BIST) software can be downloaded via this serial interface. When testing analogue inputs, e.g. air temperature, the usual technique is to provide a signal stimulus on the appropriate pin, send a command to the Unit Under Test (UUT) and read back an internal register which records the value generated by the ADC for the input under test. When testing outputs, e.g. stepper motor output, a command is sent to the UUT to turn on the relevant transistors, the output is connected to a suitable load and measurement instrument and then it is "driven" using an electronic load and power supply, or a four-quadrant V/I source. Gain values can be recalculated from external measurements and written to internal registers to correct for production tolerances.

However, even when tested in this manner, problems can occur when the EMS is completed and installed in an automobile. For example, EMSs, which have passed functional test, fail when installed in automobiles because of a change in a memory chip. One attempt to deal with this has been to fit EMSs inside an automobile at the end of the production line. The engine is then started and idled for a few minutes to verify that the EMS modules are functioning correctly. Failure can also occur after installation because the wrong operating software has been loaded, again after End of Line (EOL) functional testing has been completed. Another failure can occur when a diesel management system enters a "run away" condition in use, causing the vehicle speed to increase as fuel is pumped unchecked into the engine.

It is an object of the present invention to provide an "open loop" testing system which would allow such problems to be detected before the EMS module is installed in the automobile.

SUMMARY OF THE INVENTION

In accordance with the present invention, there is provided a system for testing an automotive engine management system (EMS), comprising: (a) means for generating a series of EMS input signals which are equivalent to input signals generated by an automobile; (b) means for applying the EMS input signals to the EMS in a manner which simulates that of the inputs from an automobile; (c) a series of loads connected to outputs from the EMS, the loads being equivalent to the loads imposed by systems within an automobile under the control of the EMS; (d) sensors for measuring the EMS outputs; and (e) means for coordinating, in real time, application of the EMS inputs and measurement of the EMS outputs.

The system according to the invention provides co-verification of the operating software with the hardware. For this to happen, the test system must simulate the EMS module's target environment, the automobile itself. Consequently, in the preferred system, input signals equivalent to those produced by sensors in an automobile are generated and updated in parallel, outputs are connected to loads and measured in parallel, the battery is simulated using a programmable power supply, serial interfaces are monitored and updated as the test progresses and the input and output events are coordinated and sequenced in real-time. Such requirements can be satisfied by a VXI-based core which offers real-time control of the test system instrumentation.

Where the EMS inputs are analogue, they can be generated by a DC source and/or an arbitrary waveform generators where the EMS inputs are frequency signals they can be generated by an arbitrary waveform generator, and where the EMS inputs are discrete inputs they can be generated by a static TTL or open collector line.

Preferably, the sensors measure multiple outputs in parallel over a predetermined period of time.

When the EMS contains a diagnostic port, it is preferred that the system access the port in order to access internal registers in the EMS so as to read back data therefrom during the test. The data can be read from the registers in parallel with sequencing of other aspects of the test.

BRIEF DESCRIPTION OF THE DRAWING

The present invention will now be described, by way of example, in relation to the accompanying drawing which shows a schematic diagram of a system according to one embodiment of the invention.

DESCRIPTION OF THE PREFERRED EMBODIMENT

Referring now to the drawing, the system shown therein comprises a VXI-based core and backplane (VXI) which allows real-time control of system instrumentation. The EMS is shown with the following inputs and outputs which it will be understood are merely representative of those found in a typical EMS:

| Inputs | Outputs |
| --- | --- |
| Crankshaft speed/phase (CR) | Injector (1 per cylinder) (In) |
| Camshaft speed/phase (CM) | Electronic Spark Timing (1 per cylinder)(SP) |
| Knock (K) | Fuel Pump (FP) |
| Road Speed (RS) | Idle Air Control (IA) |
| Air Temperature (Atemp) | Warning Lamp (W) |
| Throttle Position (T) | Fan Relay (F) |
| Water Temperature (Wtemp) | Exhaust Gas Recirculation (EGR) |
| Manifold Air Pressure (MAP) | |
| Air Conditioning Switch (AC) | |
| Brake Switch (B) | |
| Oxygen Sensor (O) | |
| Ignition (Ig) | |

The system applied appropriate loads to the outputs of the EMS so as to simulate the presence of the various instruments under the control of the EMS (not shown). Power is provided to the EMS by way of a programmable power supply unit (PPSU) which simulates the presence of the vehicle battery for the duration of the test.

Input signals to the EMS module fall into one of several categories:

Analogue inputs, represented by discrete voltages, change relatively slowly over time in a non-periodic manner. Air and water temperature (Atemp, Wtemp) have update rates of 10–100 ms and are generated using DC sources (DAC). However, throttle position (T) and manifold air pressure (MAP) vary more rapidly (<10 ms update rate) and it may be more efficient to use a multi-channel, VXY-based arbitrary waveform generator (Arb) to generate all of these signals in parallel. If the Arb latches its output to the last programmed level, a range of discrete values can be stored in memory and sequenced out in real-time using VXI triggers.

Frequency inputs follow a repeating pattern and are often linked to the speed of the engine. A real engine speed signal can be generated by a photoelectric sensor which monitors the rotation of teeth on the crankshaft. A gap or extra long tooth is used to indicate Top Dead Centre (TDC), so the engine speed is also referred to as the phase signal. In order to simulate this signal, an Arb is pre-loaded with a waveform representing one revolution of the crankshaft. Not all EMS modules are tolerant of being taken straight from zero rpm to idle speed, so acceleration and deceleration are simulated by changing the Arb's clock speed (vc) 'on the fly.' By synchronising these changes with the other input signals to within a few milliseconds, a complete speed/performance envelope can be integrated into the test strategy. The test system instrumentation is controlled in real-time using timed interrupts and VXI triggers, which can be provided using a suitable embedded controller, such as a VXI slot-0 controller, running a real-time operating system.

Some EMS modules also monitor the road speed (RS). This is generated using a variable reluctance sensor, whose output varies with frequency from 10–200 Vpp. To simulate this an Arb output drives a suitable power amplifier (VCA), with gain controlled by another synchronised voltage source.

Knock sensors detect the vibration caused when the fuel/air mixture in the cylinder detonates before normal ignition has taken place. The knock signal is a high-frequency burst with a characteristic modulation envelope and has a phase relationship to the crankshaft signal. The test system generates this by synchronising multiple Arb channels using an end of frame synch signal or VXI trigger.

$O_2$ sensors mounted around the catalytic converter are crucial to minimising fuel emissions, as any oxygen present in the exhaust dramatically lowers the catalyst's efficiency. The $O_2$ sensor generates a low-amplitude (<1 V), low frequency (<5Hz) signal. During an open loop test, this signal does not usually vary, as it is assumed that the catalyst has not yet warmed-up and so the signal is not used by the EMS module to tailor its control of the fuel injection and ignition. However, the signal must be accurately generated or the EMS will generate an error. Therefore the Arb used to generate this signal has a very high linearity (Hi-Res Arb), and any offset error present is calibrated out before starting the test sequence.

Discrete inputs monitor switch closures, such as ignition on (Ig) and air conditioning (AC). They are simulated using static TTL or open collector lines, or by using a signal matrix to connect the input to Vbatt or ground (Gnd).

CAN messages are generated by "intelligent" sensors that contain their own signal conditioning and interface to a Controller Area Network (CAN) multiplexed bus. The test system emulates multiple CAN nodes and generate messages synchronised with other input signals.

Output Signal Measurement

The most critical output signals generated by the EMS module control the fuel-injector solenoids (In) and the electronic spark timing (Sp). Another pulsed output may be used to enable the fuel pump (FP), whilst discrete outputs may be used to light malfunction lamps (W) in the dashboard. To verify EMS operation during the test, multiple outputs are measured in parallel over a representative time period of several seconds, whilst the inputs are simulated according to a pre-defined speed envelope. Measurements such as pulse width and frequency can be recorded throughout, using a multi-channel event detector (MCED) with a deep memory (>1000 samples) while discrete outputs are measured with the TTL I/O. The maximum measurement period can be extended by periodically downloading the instrument memory into a data buffer in the real-time controller. Off-line analysis can be performed after the simulation sequence has finished to evaluate if there were any extra or missing pulses during the measurement period. Measuring the statistical variation of pulse width can also provide a more meaningful assessment of the overall performance than individual pulse measurements.

The diagnostic port on the EMS module can be used during the test to access internal registers and read-back any fault conditions detected via a diagnostic interface emulator (DIE). If this can happen in parallel with the sequencing of the other test system instruments, then the overall test time can be minimised.

A system according to the present invention, such as that described above, can be implemented using a suitably programmed test system such as the S765AT system operating CATE test software available from Schlumberger Technologies. The software used for the system described above allows simple and accurate dispatch of timed events. This generates interrupts at programmed event times resulting in entry to user-written code at accurate and repeatable times. Events can be classified as high or low priority: high priority events are handled immediately they are scheduled, interrupting low priority activities if necessary. The complications of programming interrupt handlers and process priorities can be hidden from the test developer.

We claim:

1. A system functionally testing an automotive engine management system (EMS), prior to installation in an automobile comprising:

(a) means for generating a series of EMS input signals which are equivalent to input signals generated by an automobile;

(b) means for applying the EMS input signals to the EMS in a manner which simulates that of the inputs from an automobile;

(c) a series of loads connected to outputs from the EMS, the loads being electronically equivalent to the loads imposed by systems within an automobile under control of the EMS;

(d) sensors for measuring the EMS outputs;

(e) means for coordinating, in real time, application of the EMS inputs and measurement of EMS outputs in parallel comprising an embedded controller with a real time operating system;

(f) a VXI backplane for the various functional elements of the system; and (g) means for analyzing the measured output signals to assess EMS function.

2. A system as claimed in claim 1, further comprising means for monitoring and updating serial interfaces to the EMS.

3. A system as claimed in claim 1, further comprising a programmable power supply for supplying power to the EMS.

4. A system as claimed in claim 1, wherein at least one of the EMS inputs is an analogue input and is generated by a DC source and/or an arbitrary waveform generators.

5. A system as claimed in claim 1, wherein at least one of the EMS inputs is a frequency signal which is generated by an arbitrary waveform generator.

6. A system as claimed in claim 1, wherein at least one of the EMS inputs is a discrete input which is generated by a static TTL or open collector line.

7. A system as claimed in claim 1, wherein the sensors measure multiple outputs in parallel over a predetermined period of time.

8. A system as claimed in claim 1, wherein the EMS contains a diagnostic port, the system accessing the port in order to access internal registers in the EMS so as to read back data therefrom during the test.

9. A system as claimed in claim 8, wherein data is read from the registers in parallel with sequencing of other aspects of the test.

10. A system as in claim 1 further comprising means for providing co-verification of the actual operating software and hardware of an automotive engine management system.

11. A system as in claim 1 wherein the applying means is arranged for synchronizing the EMS input signals over time to simulate a speed/performance envelope.

* * * * *